(12) United States Patent
Elias et al.

(10) Patent No.: US 7,002,800 B2
(45) Date of Patent: Feb. 21, 2006

(54) INTEGRATED POWER AND COOLING ARCHITECTURE

(75) Inventors: J. Michael Elias, Orlando, FL (US); Bruce M. Cepas, Orlando, FL (US); James A. Korn, Orlando, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 599 days.

(21) Appl. No.: 10/107,177

(22) Filed: Mar. 28, 2002

(65) Prior Publication Data

US 2003/0143958 A1 Jul. 31, 2003

Related U.S. Application Data

(60) Provisional application No. 60/350,924, filed on Jan. 25, 2002.

(51) Int. Cl.
*H05K 7/20* (2006.01)

(52) U.S. Cl. ............... 361/700; 361/679; 361/690; 361/708; 165/104.33; 174/15.1

(58) Field of Classification Search ............... 361/688, 361/690, 600–605, 702–712, 715, 717, 718–724, 361/816, 818; 257/706–727; 165/80.2, 165/80.3, 10, 45, 168, 104.32, 104.33; 174/151.1, 174/15.2, 16.3; 343/700, 853
See application file for complete search history.

(56) References Cited

U.S. PATENT DOCUMENTS

| 4,047,198 | A | | 9/1977 | Sekhon et al. |
| 4,101,804 | A | | 7/1978 | Carlsson |
| 4,727,455 | A | * | 2/1988 | Neidig et al. ............... 361/700 |
| 4,739,448 | A | | 4/1988 | Rowe et al. |
| 5,007,478 | A | | 4/1991 | Sengupta |
| 5,128,689 | A | | 7/1992 | Wong et al. |
| 5,224,356 | A | | 7/1993 | Colvin et al. |
| 5,283,715 | A | * | 2/1994 | Carlsten et al. ............. 361/702 |
| 5,315,154 | A | * | 5/1994 | Elwell ........................ 257/707 |
| 5,325,913 | A | * | 7/1994 | Altoz ........................ 165/287 |
| 5,353,498 | A | | 10/1994 | Fillion et al. |
| 5,366,801 | A | | 11/1994 | Bryant et al. |
| 5,424,519 | A | | 6/1995 | Salee |
| 5,455,458 | A | * | 10/1995 | Quon et al. ................. 257/714 |
| 5,567,544 | A | | 10/1996 | Lyman |
| 5,629,838 | A | | 5/1997 | Knight et al. |

(Continued)

OTHER PUBLICATIONS

Cepas et al., U.S. Appl. No. 09/974,033, entitled "Integrally Formed Energy Storage Device and Method of Fabrication" filed Oct. 10, 2001.

(Continued)

*Primary Examiner*—Michael Datskovskiy
(74) *Attorney, Agent, or Firm*—Buchanan Ingersoll PC

(57) ABSTRACT

An integrated thermal apparatus for improved electronic device performance has an energy storage device coupled with a thermoelectric management device for managing thermal energy generated by the electronic device. The thermoelectric management device can include a semiconductor thermoelectric device and phase change material, which can be integrated into a foam aluminum structure. The energy storage device can be a nanometallic device. The electrical load electrical efficiency is improved by co-locating it with thermoelectric management device directly on a composite substrate foundation to provide enhanced waste heat conversion to electrical energy. The apparatus manages the thermal and power issues at the substrate level in close proximity to the electrical load and incorporates the needed thermal mass into the support structure by way of a phase change material.

47 Claims, 9 Drawing Sheets

U.S. PATENT DOCUMENTS

| | | |
|---|---|---|
| 5,630,961 A | 5/1997 | Salee |
| 5,793,603 A | 8/1998 | Lyman |
| 5,804,297 A | 9/1998 | Colvin et al. |
| 5,851,338 A | 12/1998 | Pushaw |
| 5,955,188 A | 9/1999 | Pushaw |
| 6,037,032 A | 3/2000 | Klett et al. |
| 6,073,684 A | 6/2000 | Fiechter et al. |
| 6,076,595 A | 6/2000 | Austin et al. |
| 6,077,597 A | 6/2000 | Pause |
| 6,099,894 A | 8/2000 | Holman |
| 6,111,192 A | 8/2000 | Bell et al. |
| 6,169,247 B1 | 1/2001 | Craft, Jr. et al. |
| 6,171,647 B1 | 1/2001 | Holman |
| 6,181,558 B1 | 1/2001 | Gordon |
| 6,202,739 B1 | 3/2001 | Pal et al. |
| 6,208,254 B1 | 3/2001 | McQueen et al. |
| 6,212,074 B1 | 4/2001 | Gonsalves et al. |
| 6,219,218 B1 | 4/2001 | Nial, Jr. et al. |
| 6,226,173 B1 | 5/2001 | Welsch et al. |
| 6,239,502 B1 | 5/2001 | Grewe et al. |
| 6,261,871 B1 | 7/2001 | Langari et al. |
| 6,270,836 B1 | 8/2001 | Holman |
| 6,297,775 B1 * | 10/2001 | Haws et al. ......... 343/700 MS |
| 6,300,564 B1 | 10/2001 | Moraes et al. |
| 6,307,871 B1 * | 10/2001 | Heberle ....................... 372/34 |
| 6,317,321 B1 | 11/2001 | Fitch et al. |
| 6,341,056 B1 | 1/2002 | Allman et al. |
| 6,359,343 B1 * | 3/2002 | Langari et al. ............. 257/789 |
| 6,418,017 B1 | 7/2002 | Patel et al. |
| 6,477,035 B1 | 11/2002 | Cepas et al. |

OTHER PUBLICATIONS

Elias et al., U.S. Appl. No. 10/166,202, entitled "Method and Apparatus for Absorbing Thermal Energy" filed Jun. 11, 2002.

* cited by examiner

INTEGRATED POWER AND COOLING ARCHITECTURE

This application claims priority under 35 U.S.C. § 119(e) to U.S. Provisional Application No. 60/350,924 entitled INTEGRATED POWER AND COOLING ARCHITECTURE and filed on Jan. 25, 2002, the entire content of which is hereby incorporated by reference.

BACKGROUND

1. Field of Invention

The present apparatus relates generally to integrated thermal management structures and energy storage components. More specifically, the apparatus relates to an integrated architecture that provides electrical power and cooling to an on-structure electrical load.

2. Background Information

Electronics, such as radio frequency (RF) transmit/receive electronics, can be relatively inefficient, e.g., 15–25% at converting electrical energy to radiated power and therefore generate large amounts of heat. The electronics often do not have sufficient thermal mass to absorb this waste heat with consequential rapid junction rise and component failure. Traditional thermal management solutions to address this problem can add significant volume and complexity and can limit device miniaturization.

In addition, RF power amplifiers, such as those found in cellular telephones, web-enabled communication and personal data assistant (PDA) devices, and wireless broadband data link systems, can incur voltage droop during transmission. Voltage droop translates directly to a drop in microwave amplifier RF gain. Voltage droop can become more difficult to minimize as the RF power increases. To minimize voltage droop, existing capacitor technologies, such as traditional ceramic- and tantalum-based capacitors, are used to satisfy high power demands of amplifiers during a transmit pulse. The energy density of commercial ceramic-based and tantalum-based capacitors is adequate to support the full load pulse of microwave amplifiers that produce low RF energy using minimal DC input power. However, with higher power RF power amplifiers, the overall volume and weight increase when using existing capacitor technologies. In certain instances, there is insufficient volume to package these traditional capacitor technologies to provide adequate RF performance at higher power levels.

SUMMARY

The present invention is directed to thermal management structures and energy storage components that can allow for increased output power and higher reliability operation without increasing the prime or point-of-load power source and can contribute to miniaturization and smaller packaging envelopes.

Exemplary embodiments are directed to an integrated power and cooling apparatus for electronics. In an exemplary embodiment, the integrated power and cooling apparatus has a substrate having an electrical conductor, an energy storage device mounted on the substrate, an electrical load mounted on the substrate in electrical communication with the energy storage device, and a thermal management structure abutting the substrate and in thermal communication with at least a portion of a heat producing section of the electrical load. The thermal management structure has a structural support and a phase change material integrated into a void space of the structural support. The thermal management structure can also have a thermoelectric device in electrical communication with the electrical load and in thermal communication with both the portion of the heat producing section of the electrical load and the phase change material.

In another exemplary embodiment, the integrated power and cooling apparatus for electronics has a substrate with an electrical conductor on at least one side thereof, an electrical load mounted on the substrate in electrical communication with the electrical conductor, and a thermal management structure abutting the substrate and in thermal communication with at least a portion of a heat producing section of the electrical load. The thermal management structure has a structural support, a phase change material integrated into a void space of the structural support, and a thermoelectric device. The thermoelectric device is in electrical communication with the electrical conductor and in thermal communication with both the heat producing portion of the electrical load and the phase change material. The integrated power and cooling apparatus for electronics can also have an energy storage device mounted on the substrate in electrical communication with the electrical load.

In other embodiments, a transmit/receive apparatus has a substrate with an electrical interconnect circuit on at least one side thereof, a plurality of electronic components defining an electronics submodule. The electronics submodule is disposed on the substrate in electrical communication with the electrical interconnect circuit. A radiating element is proximate an outer surface of the transmit/receive apparatus and in electrical communication with the electronics submodule. An energy storage device mounted on the substrate is in electrical communication with the electrical interconnect circuit and a thermal management structure abuts the substrate and is in thermal communication with at least a portion of the heat producing section of the electronics submodule. The thermal management structure has a structural support and a phase change material integrated into a void space of the structural support.

The transmit/receive apparatus can have an outer shell disposed as the outermost layer about at least a portion of the outer surface of the transmit/receive apparatus. In addition, the thermal management device can have a thermoelectric device in electrical communication with the electrical interconnect circuit and in thermal communication with the portion of the heat producing section of the electronics submodule and at least a portion of the phase change material.

An exemplary apparatus positioned in an airborne vehicle for transmitting or receiving electromagnetic radiation has a unit within a faradaic shield with a plurality of electronic elements, at least one energy storage device, at least one substrate, and at least one thermal management structure. At least one radiating element has a first surface that is conformal to an outer surface of the airborne vehicle. A second surface is in electrical communication with the unit. Each of the electronic elements, the energy storage device, the substrate, and the thermal management structure are arranged in a planar-stacked arrangement. The electronic elements and the energy storage device are electronically interconnected to produce a desired wavelength of electromagnetic radiation emitted from the radiating element. The electronic elements, the energy storage device, the substrate, and the thermal management structure are in thermal contact to maintain a temperature of at least the electronic components below a predetermined temperature.

The thermal management structure has a phase change material integrated into a void space of a support structure for the unit. The phase change material is selected to have a phase change at or below the predetermined temperature. The thermal management structure can have a thermoelectric device arranged between the electronic components and the phase change material.

An exemplary method to manage thermal energy generated by an electronic device is also provided, in which, a thermal gradient is developed across a thermal management structure comprising a phase change material. Electrical energy is supplied to the electronic device, which generates thermal energy. A first portion of the thermal energy generated by the electronic device is dissipated using the phase change material. The first portion of the thermal energy from the step of dissipating can produce a phase change in the phase change material. At least a second portion of the thermal energy generated by the electronic device is absorbed using a thermoelectric device positioned between the electronic device and the phase change material. The thermal energy absorbed by the thermoelectric device is converted into electrical energy and supplied to the electronic device.

BRIEF DESCRIPTION OF THE DRAWINGS

Objects and advantages of the invention will become apparent from the following detailed description of preferred embodiments in connection with the accompanying drawings, in which like numerals designate like elements and in which.

DETAILED DESCRIPTION OF THE PREFERRED EMBODIMENTS

Figure 1:
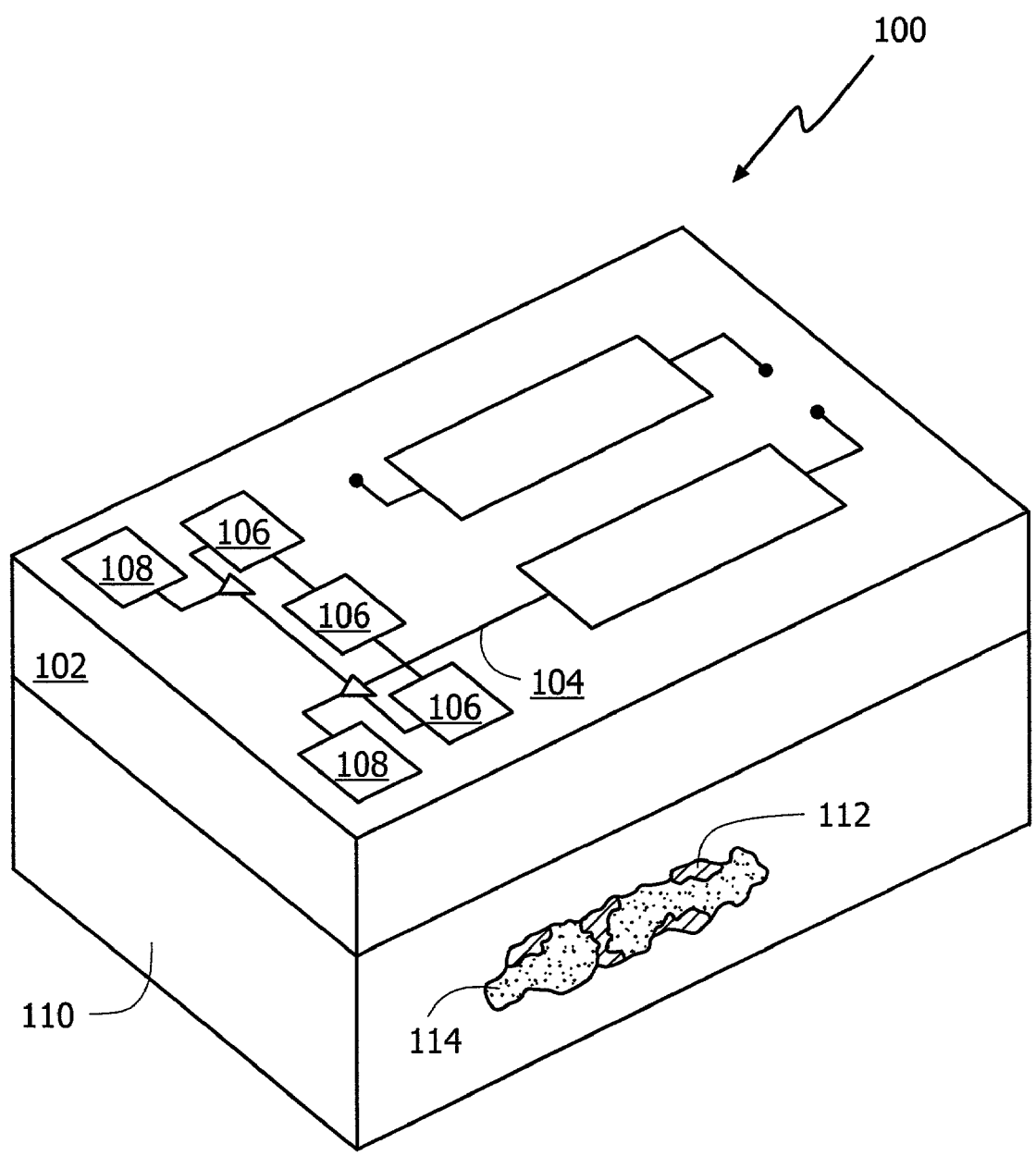
FIG. 1 is an exemplary embodiment of an integrated power and cooling apparatus for electronics.

An exemplary integrated power and cooling apparatus for electronics is illustrated in FIG. 1 as an apparatus 100. The FIG. 1 apparatus 100 includes a substrate 102 having an electrical conductor 104, an energy storage device 106 mounted on the substrate 102, an electrical load 108 mounted on the substrate 102 in electrical communication with the energy storage device 106, and a thermal management structure 110 abutting the substrate 102. The thermal management structure 110 has a structural support 112 and a phase change material 114 integrated into a void space of the structural support 112. The thermal management structure 110 is in thermal communication with at least a portion of a heat producing section of the electrical load 108.

The apparatus has a substrate represented by substrate 102. In exemplary embodiments, the substrate is a composite-based or metallic-based structure. For example, the substrate can be graphite or silicon-carbide-aluminum (SiC/Al) based. The substrate has suitable thermal transport properties to allow conductive thermal transport through the substrate. For example, the thermal transport properties are a minimum ten times more than the thermal transport properties of a typical polyamide printed circuit board (PCB), or of any other suitable properties.

The substrate has an electrical conductor. For example, the electrical conductor can be any conductor that electrically connects electronic components. The electrical conductor can be a multilayer electronic conductor, as in a dual damascene integrated circuit, or a surface conductor, as in a trench formed by suitable means, e.g., etching, ion bombardment, and so forth, and filled by conducting materials, e.g., PVD, CVD, or electrochemical deposition of materials. In an exemplary embodiment and as shown at 104, the electrical conductor can be a conducting metal, such as gold, aluminum, copper, and so forth, that is in the form of a trace on the surface or embedded into the surface of the substrate. In an additional exemplary embodiment, the electrical conductor is on at least one side of the substrate and/or is patternized, e.g., the electrical conductor is arranged to electrically connect nodes, components, or other features.

An energy storage device is mounted on the substrate. The energy storage device can be surface mounted on the substrate with the positive and negative electrodes in electrical communication with the electronic conductor, e.g., soldered, braised, contact, or pressure fit with the electronic conductor of the substrate. Additionally, the body of the energy storage device can also be mounted to maximize thermal communication with the substrate, e.g., abutting, conformal, contacted with thermal paste, and so forth.

In an exemplary embodiment, the energy storage device can be an energy storage capacitor which can be used to supply peak power to the electrical load. For example, the energy storage device, as represented by 106, is a titanium or titanium-based capacitor. In an exemplary embodiment, at least one electrode of the energy storage device is made from titanium or a titanium-based alloy. In an additional example, the energy storage device can be used to supply peak power during the high load demand, such as a transmit pulse, of a duty cycle-type electrical load, e.g., a microwave power amplifier (MPA), radio frequency (RF) transmit/receive elements, and so forth. The energy storage device can then be recharged between transmit pulses using, for example, a DC/DC converter, a prime power supply, or any desired recharging mechanism. In one aspect, the amount of energy stored in the energy storage device can be used to limit voltage droop during the transmit pulse.

One example of an energy storage device suitable for use is a titanium or titanium-based alloy energy system. Commonly owned U.S. patent application Ser. No. 09/974,033 filed Oct. 10, 2001 ("Integrally Formed Energy Storage Device and Method of Fabrication"), the entire contents of which are herein incorporated by reference, discloses structures having integrally formed energy storage devices and methods to provide such structures. U.S. Pat. No. 6,226,173, the entire contents of which are herein incorporated by reference, discloses alternative titanium and titanium-based alloy energy storage devices. The application of titanium and titanium-based alloy capacitors can reduce the volume and weight of the system, such as in a high power microwave amplifier application.

In an exemplary embodiment, the energy storage device is configured to contain adequate energy density to support a desired voltage during a transmit pulse, and possess sufficient power density to respond to load changes associated with the electrical load. The energy density can be described in Joules (J) per unit volume or weight. Energy density metrics can be used to compare energy storage materials, e.g., capacitive materials, and determine the desired volume and weight. For example, a titanium and titanium-based alloy energy storage device can be integrated with, and can be in close proximity to, other components of the apparatus, such as the electrical load on the substrate. Mounting the energy storage device on the substrate can be used to lower the interconnect impedance and alter, e.g., improve, the load transition response of the electrical load.

The power density of the capacitor constitutes the ability of the energy storage device to transfer energy in a unit of time per unit volume or weight. Power density capacitors can meet load pulse transitions of beyond 10 GHz. However, the load transitions warrant selection of suitable energy storage material, interconnects and packaging.

For example, high inductance will delay power transfer or limit current transients from the energy storage capacitor to the microwave amplifier. Further, delays in power transfer can cause voltage droop which translates to limited output power of electrical loads. Inductance between the energy storage device, e.g., capacitor, and the electrical load, e.g., MPA, RF transmit/receive elements, radiating elements, and so forth, can be caused by many factors. The electrical conductor can cause trace or lead inductance and the distance between the components can limit pulse transients. As an example, it has been found that parasitic inductance of 20 nH per inch exists for trace routing over ground planes. This distance effect illustrates the effect of placement and size of the energy storage device on performance of RF transmit/receive elements and suggests that the energy storage device be placed as close as physically possible to the electrical load. Therefore, minimizing inductance between the energy storage device and the electrical load can enable electrical load performance to improve, e.g., for a microwave power amplifier, the lower the inductance the higher the achievable slew rate, which improves the repetition rate and fidelity of the transmitter.

The application of titanium and titanium-based alloy capacitors for energy storage can allow placement of the energy storage on a common substrate with the electrical load, such as a microwave power amplifier, and can contribute to optimizing the electrical interface by minimizing the inductance.

Current energy storage devices are limited by power density and energy density and are physically separated from the electrical load, such as a MPA. A titanium and titanium-based alloy capacitor has high energy density than current energy storage devices, e.g., traditional ceramic- and tantalum-based capacitors, resulting in a small physical package that meets the required voltage requirements of the electrical load. The titanium and titanium-based alloy capacitor also has a high power density resulting in a small physical package that minimizes the interconnect inductance and overall impedance. The titanium and titanium-based alloy capacitor energy density is such that its small physical size allows co-locating it with the electrical load on a common substrate.

Titanium and titanium-based alloys for electrode materials can be used as a high performance power source. The high dielectric constant of titanium and titanium-based alloys as compared to traditional capacitor technology (for example, ceramic, tantalum, and so forth) yields increased energy and power performance. Electrochemical energy storage devices with first electrodes formed from titanium or titanium-based alloys can exhibit a wide voltage range (from 5 to greater than 500 V), and low leakage current and can store from 1 to greater than 300 KJ of energy. In accordance with exemplary embodiments, electrodes can be independent titanium or titanium-based alloy materials or can be formed from structural materials (e.g., the structure itself can be integrated for use as one of the two electrodes). Integral formation of electrodes from structural components is disclosed in commonly owned U.S. patent application Ser. No. 09/974,033 filed Oct. 10, 2001 ("Integrally Formed Energy Storage Device and Method of Fabrication"), the entire contents of which are herein incorporated by reference. Thus, integral packaging and volume specific packaging that more efficiently utilize available volume space in an apparatus can be provided. In optional embodiments, titanium and titanium-based alloys can be surface area enhanced, thereby increasing the surface area and yielding higher energy storage per unit area.

Surface enhancement of the anode electrode in a titanium or titanium-based alloy energy storage device can include surface enhancement by physical and/or chemical techniques. For example, commonly owned U.S. patent application Ser. No. 09/974,033 filed Oct. 10, 2001 ("Integrally Formed Energy Storage Device and Method of Fabrication"), the entire contents of which are herein incorporated by reference, discloses surface enhancement methods for integrally formed energy storage devices. Further surface enhancement methods can include ion bombardment techniques, ion milling, CVD, PVD, and physical techniques, such as grinding, roughening, and so forth. In an additional option for surface enhancement, U.S. Pat. No. 6,226,173, the entire contents of which are herein incorporated by reference, discloses a chemical method of surface modification to increase the power and energy density of titanium and titanium-based alloy energy storage devices.

The surface of the first electrode can be enhanced to a desired degree by suitable methods (e.g., by physical or chemical techniques) and the power and energy density of the associated energy storage device can thereby be increased. For example, in metal electrode applications, total surface area can be enhanced by physical or chemical techniques such as ion bombardment techniques, ion milling, CVD, PVD, grinding, roughening, and so forth; in semiconductor applications, surface enhancement can occur by altering the surface chemistry of a semiconductor surface in the portion of the substrate that will be formed into the electrochemical energy storage device, e.g., the position where the dielectric layer is to be formed. When used as an energy storage device formed over semiconductor electronics, the energy storage device can provide localized filtering and voltage holdup. Additionally, forming energy storage devices on semiconductors can eliminate the interface lead and associated inductance, thereby improving the frequency response and filtering capability. In this embodiment, local energy storage and filtering capacitors can be formed directly on semiconductors to eliminate the need for discrete capacitors.

Packaging techniques can include forming capacitors directly on component substrate structures using thin film deposition techniques. For example, sputtering can be utilized to deposit a titanium or titanium-based alloy directly onto a selected substrate. Other suitable thin film processing techniques include retort synthesis, E-Beam, vapor deposition, and sputtering processes. Optionally, further processing steps form the titanium or titanium-based alloy into a directionally grown sponge with a dendritic structure. In a further example, thin film deposition techniques can form a thin film of titanium or titanium-based alloy on semiconductor electronic devices to form capacitors for energy hold-up during power interruptions.

As an alternative or in conjunction with forming components directly on component substrate structures, directionally grown sponge having a dendritic structure can be utilized to form the electrode. Directionally grown sponge utilized as an anode is disclosed in U.S. Pat. No. 6,226,173 B1, the disclosure of which is herein incorporated by reference.

Subsequent to formation of the first electrode, a dielectric layer and solid electrolyte are positioned. Any suitable method for applying the dielectric layer and second electrode can be used. In one example, a dielectric film can be formed by oxidizing the surface of an electrode. For example, when utilizing titanium as the electrode, oxidation results in titanium oxide. Alternatively, titanium-based alloys can be used as the dielectric layer. Examples of suitable titanium-based alloys include barium titanate (BaTiO$_3$) and lead-zirconium titanate (PbZrTiO$_3$). Still further, alternative methods for providing a dielectric layer on an electrode can include the use of oxides, ceramics, or polymers, all of which can form suitable dielectric film, and the formation of oxide film by thermal oxidation in an oxygen-containing atmosphere. Other suitable alternative methods of forming a dielectric layer are disclosed in U.S. Pat. No. 6,226,173 B1, the disclosure of which is herein incorporated by reference.

The energy storage device can provide additional functions in the apparatus, include providing filtering functions, such as a lowpass filter, reducing DC/DC switching ripple and absorbing system noise. Further, the use of energy storage devices consistent with the description herein can provide decoupling to logically controlled electronics.

Table 1 shows a comparison between existing capacitor technology and exempalry titanium or titanium-based alloy capacitor technology (nanometallic technology). The nanometallic technology provides energy storage capability at a smaller size, a lighter weight and in lower cost per farad. Additionally, nanometallic technology provides a low effective series resistance, thereby low dissipation, and a low effective series inductance, thereby fast response times up to 10 megahertz bandwidth.

TABLE 1

| Technology | Li Ion Battery | EVANS Hybird | Ultra Capacitor | Chip Capacitor | Titanium Alloy Capacitor |
| --- | --- | --- | --- | --- | --- |
| Energy Density (Wh/kg) | 150 | 1 | 5 | 0.1 | 15 |
| Power Density (KW/kg) | 0.5 | 150 | 6 | 100 | 10000 |
| Voltage Rating/Cell | 2.5 | 300 | 2.5 | 200 | 50 |
| Frequency Limit (Hz) | 2 | 2,000 | 10 | 10,000 | 10,000,000 |
| Charge Time (s) | 20000 | 0.015 | 30 | 0.001 | 0.0001 |

An electrical load, as represented by load 108, is mounted on the substrate in electrical communication with the energy storage device. In an exemplary embodiment, the electrical load is a component in an antenna radar system. Alternatively, exemplary embodiments can include a monolithic millimeterwave integrated circuit (MMIC), a MPA or a RF transmit/receive element.

A thermal management structure abuts the substrate and is in thermal communication with at least a portion of the electrical load. A thermal management structure, represented by 110, comprises a structural support and a phase change material integrated into a void space of the structural support. In an exemplary embodiment, the structural support is a foam aluminum material; examples of foam aluminum include duocel aluminum available from ERG Industries of Oakland, Calif. Other materials that can be used as the structural support of the thermal management structure include aluminum plates, other metallic plates, and/or metallic-based or composite-based porous structures having an internal void volume. The structural support of the thermal management structure is formed of material that can be a thermal conductor between the substrate and the electrical load and energy storage device mounted thereon and the phase change material. For example, the structural support abuts the substrate at a portion of the substrate that corresponds to the heat producing section of the electrical load. Thus, the thermal management device sees at least a portion of the waste heat generated by the components when the electronics are in operation.

Figure 2:
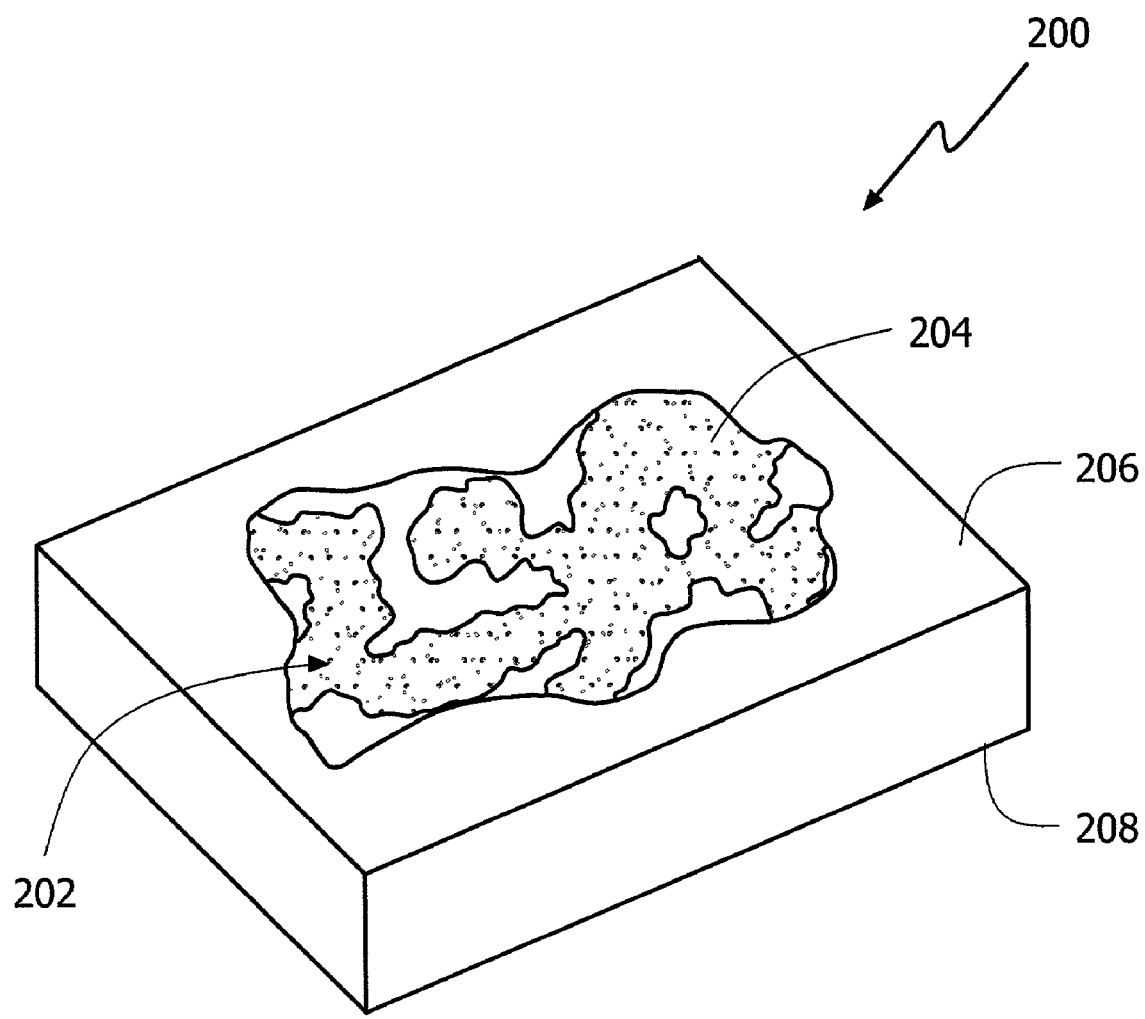
FIG. 2 is an embodiment of a support structure having a core containing a phase change material.

The phase change material can be integrated into a support structure of the thermal management device. For example and as represented in FIG. 2, the support structure 200 can have a core 202 containing a phase change material 204 positioned between opposing first and second surfaces 206, 208, respectively. The core 202 can be an open structure, e.g., contains a void volume, or can be a permeable structure, e.g., sponge-like.

In an exemplary embodiment, the support structure is a duocelan aluminum foam metal with a continuously connected, duodecahedronal shaped open-cell geometry within the core and aluminum first and second surfaces. Such a duocelan aluminum foam aluminum foam metal can be obtained from ERG Materials and Aerospace Corporation of Oakland, Calif. Density and cell size are independently variable, with available density ranges from 3% to 50% relative to the solid base metal and cell density of 5, 10, 20 and 40 pores per linear inch. Duocelan aluminum foam can be cut, turned, milled, drilled, rolled and finished to normal tolerances just like the base aluminum material. Further manufacturing methods include vacuum- or dipped-brazing, epoxy or adhesion bonding, heat treating, anodizing, and coating, plating and finishing, e.g., alodine coating or metal plating, and so forth). When brazed to metals, duocelan aluminum foam can form an integral metal-to-metal bond. In addition to aluminum, a duocelan geometry can be practiced in other suitable support structure material, such as vitreous carbon and ceramic based materials.

Phase change materials are a group of materials that change phase, e.g., a transformation from solid to liquid, liquid to gas, solid to gas, and/or the reverse transformations, over a narrow temperature range while absorbing large amounts of heat energy. A portion of the absorbed heat corresponds to the absorption of the latent heat of melting or the latent heat of vaporization for a solid-liquid phase change and a liquid to gas phase change, respectively. Accordingly, the phase change material can be any material that undergoes an endothermic reaction, e.g., phase change, within a desired temperature range of the integrated power and cooling apparatus.

For example, it is desirable that electronic components be maintained below a maximum temperature at which dielectric breakdown, junction failure, and other debilitating failures can occur, e.g., for GaAs or SiC materials, the temperature is about 90° C. and about 120° C., respectively. Accordingly, it is desirable that the phase change materials operate, e.g., change phase, at or below the maximum temperature for a particular electronic component.

The phase change material can make available additional thermal mass for rapid waste heat absorption, e.g., waste heat generated from the electrical load can be absorbed by the phase change material both to increase the temperature of the phase change material as well as to cause the phase change and to thereby limit the temperature transient caused by operation of electrical load. The increased thermal mass in the form of a phase change material incorporated into the support structure can minimize the impact on the electrical load, the energy storage device, electrical conductor and other associated electronics and electrical circuitry and reduce the incidence of heat related component failure. For example, a suitably integrated support structure and phase change material, e.g., a support structure for the transmit/receive electronics and/or a support structure for the thermal management structure is impregnated with a material that undergoes a phase change in the temperature range associated with the heat dissipated by the transmit/receive electronics. In operation, the electrical load (and other substrate mounted electronics and energy storage device) generates waste heat. Accordingly, the phase change material absorbs the thermally conducted waste heat from the substrate and raises the temperature of the phase change material to the phase change temperature, at which temperature the phase change material remains while continuing to absorb the heat and undergoing the phase change. Thus, the thermal management structure can contribute to maintaining junction temperatures below critical levels during operation of the electrical load.

Phase change materials are a group of materials that change phase from a solid phase to liquid phase over a narrow temperature range near room temperature while absorbing large amounts of heat energy. A phase change material melting temperature (the narrow temperature range where the phase change occurs) can range from 0° C. to 100° C. The phase change material latent heat of fusion (energy absorbed while changing phase; an energy to mass ratio) can range form 30 to 150 BTU/pound of material. Common phase change materials are operative over a wide range of temperatures and include such examples as ice (melting temperature of 32° C. and heat of fusion of 144 BTU/pound) and paraffin wax used in candle making (melting temperature of 126° F. and heat of fusion of 63 BTU/pound). Other physical properties influencing the performance of phase change materials include the solid specific heat (parameter of heat absorbed as a function of temperature in a single phase), solid and liquid thermal conductivity (parameter of heat transport within the material) and solid and liquid specific density (parameter of mass to volume).

Commercial phase change materials can be found in several forms including granulate, powder, paste and microencapsulated (phase change material in small polymer spheres). In general, factors to consider when selecting a phase change material include: ecologically impact; toxicity; chemical inertness to other materials; longevity; stability throughout multiple cycles; ability to be recycled; ease of handling, and narrowness of melting temperature band.

Figure 3:
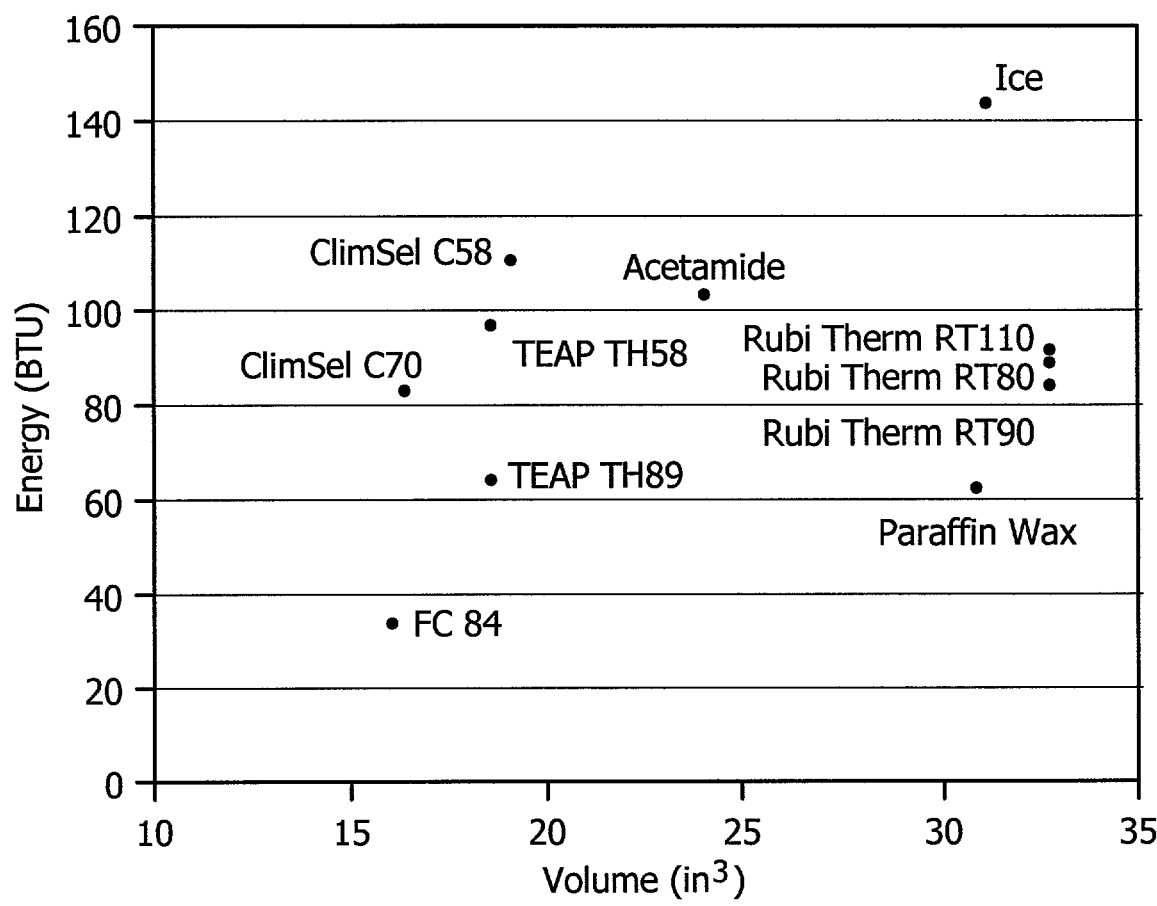
FIG. 3 shows the heat of fusion verses specific volume for several commercial phase change materials.

The phase change material can be located very near the electrical load to effectively absorb waste heat. However, the available volume can be limited due to the high-density packaging of individual elements of the electrical load, e.g., the RF transmit/receive elements, microwave power amplifiers, and so forth. Therefore a phase change material with a large heat of fusion and high specific density is desired for electrical loads that are densely packaged. FIG. 3 shows the heat of fusion verses specific volume for several commercial phase change materials including Rubitherm® available from Rubitherm Gmbh of Hamburg Germany, Climsel® available from Climator AB of Skovde, Sweden, and TEAP® available from TEAP Energy of Wangara, Australia.

The phase change material can be disposed in the support structure by suitable means. For example, the phase change material can be impregnated into the support structure under pressure or vacuum (e.g., injected by a carrier gas, vacuum dragged, and so forth). Alternatively, the phase change material can have its temperature changed to undergo a phase change to a malleable state (e.g., changed to a liquid or a viscous condition) and then poured, injected, or encapsulated in the phase change material.

In an exemplary embodiment of an apparatus for supplying power to an electrical load, a foam aluminum support structure can have a phase change material embedded within the open-cell volume. This combination provides structural support for the electrical load, e.g., MPA, RF transmit/receive element, and so forth, while supplementing the thermal capacity of the system and providing the ultimate heat sink. Waste heat from the electrical load can be transported through the foam aluminum structure where it contacts the phase change material. The solid phase change material can absorb the heat while its temperature rises to the solid-to-liquid phase change temperature. The heat continues to be absorbed while the solid changes to liquid. The phase change temperature and thermal resistance between the MPA and phase change material fix the temperature of the electrical load, at least during the phase change.

The thermal management structure can include a thermoelectric (TE) device for converting at least a portion of the thermal energy produced by the electric load into electrical energy. TE devices are solid-state heat pumps that are functionally similar to conventional refrigerators, creating a temperature differential by moving heat from one area to another. Traditional TE devices are composed of an array (from one to hundreds) of thermoelectric couples (p- and n-type semiconductor material) connected electrically in series and thermally in parallel and sandwiched between two ceramic plates.

Figure 4:
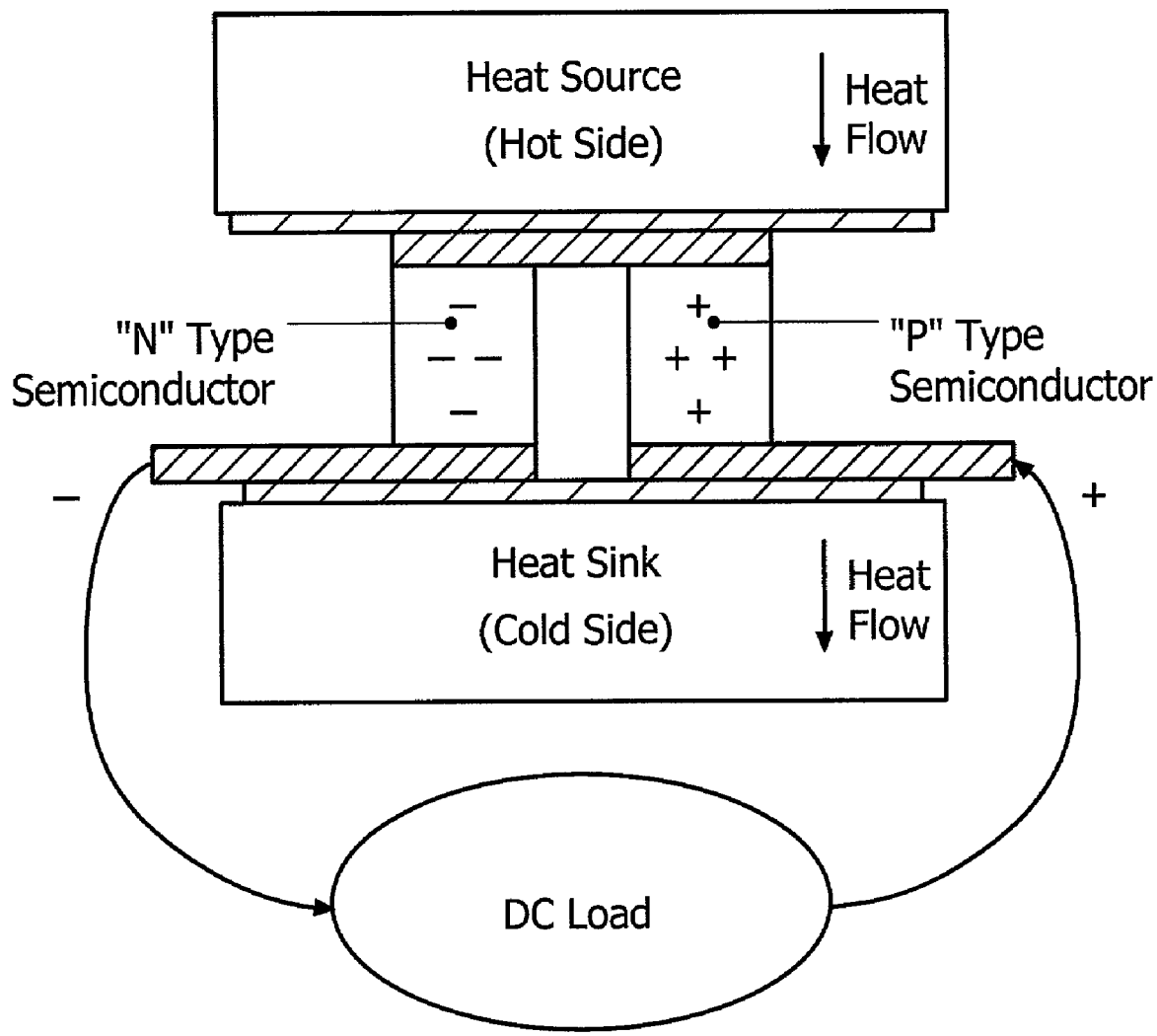
FIG. 4 is a schematic diagram illustrating the thermal to electric conversion process in a TE device.

TE devices operate in one of three modes. When connected to a DC power source, heat will be absorbed at one end of the device, cooling it, while heat is rejected at the other end, where the temperature rises (Peltier effect). As a result, the device can be used to cool a component (first mode) or, reversing the current, heating a component (second mode). When operating as an open circuit, the TE device acts as a simple thermocouple (third mode). Maintaining a temperature gradient across the device results in an electrical potential that can be connected to an electrical load (Seebeck effect). FIG. 4 is a schematic diagram illustrating the thermal to electric conversion process in a TE device.

By utilizing the first mode, the TE device can advantageously convert at least a portion of the heat energy created by the electrical load to electrical energy. Converting waste heat back into electrical energy can increase the overall efficiency of the electrical load offering size reductions in the energy storage device. This conversion process also applies to the waste heat from other electrical loads, such as central processor waste heat and thermal battery waste heat, with similar size reductions in the energy storage device or devices.

Figure 5:
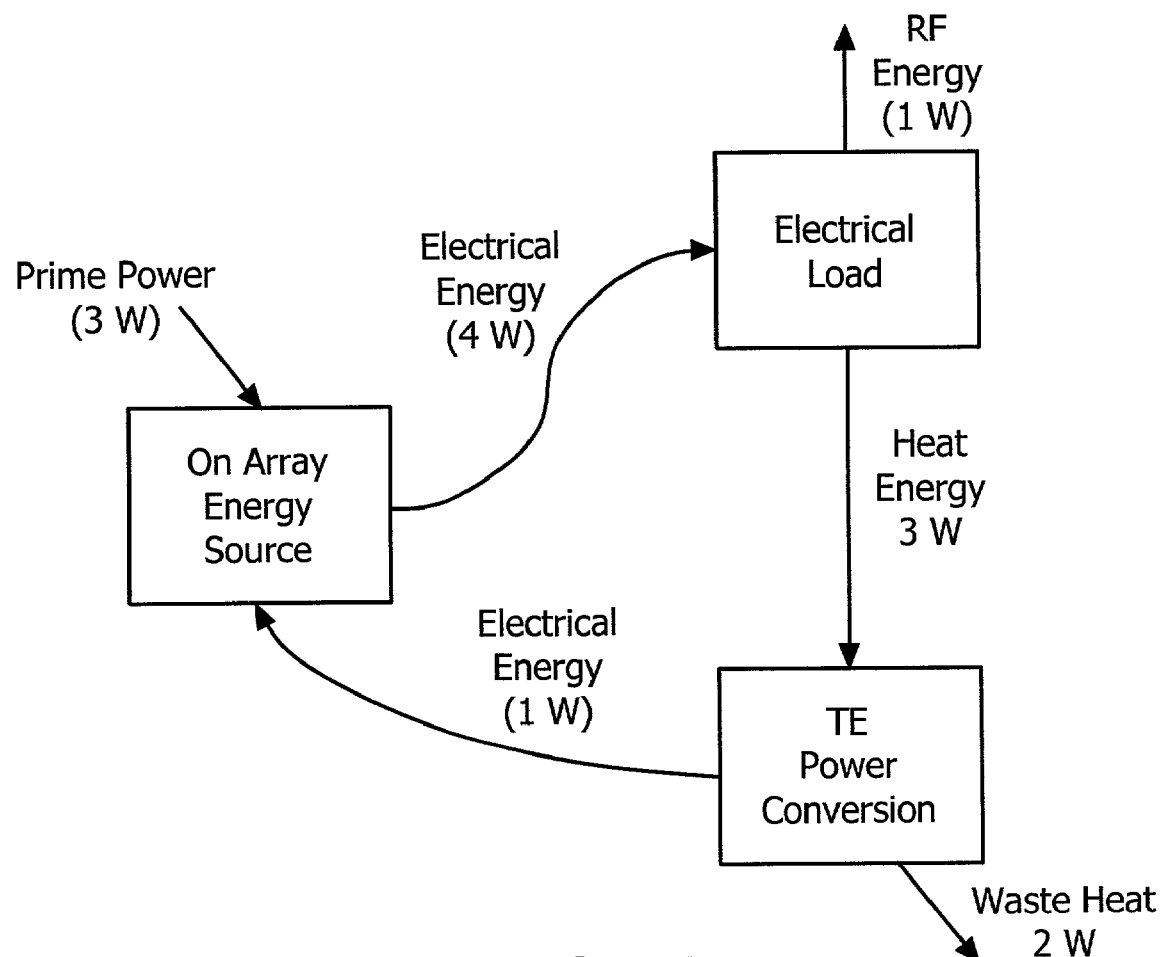
FIG. 5 is a schematic representation of the thermal to electric generation process in a thermoelectric device.

Thermoelectric materials and processes can be applied to an integrated power and cooling architecture, resulting in improved efficiencies of electrical loads, such as RF transmit/receive element, microwave power amplifiers, and so forth. For example, current RF transmit/receive elements inefficiently convert electrical energy to RF radiated power resulting in a large quantity of waste heat. For every one watt of radiated energy, an electrical load, such as a microwave power amplifier, requires four watts of electrical energy for an overall efficiency of 25%. The three watts not radiated become waste heat. This is shown schematically in FIG. 5. Including a 33% efficient TE device (as shown in FIG. 3) recycles ⅓ of the waste heat back to the MPA as electrical energy resulting in an overall efficiency of 33% (a 33% improvement).

Figure 6:
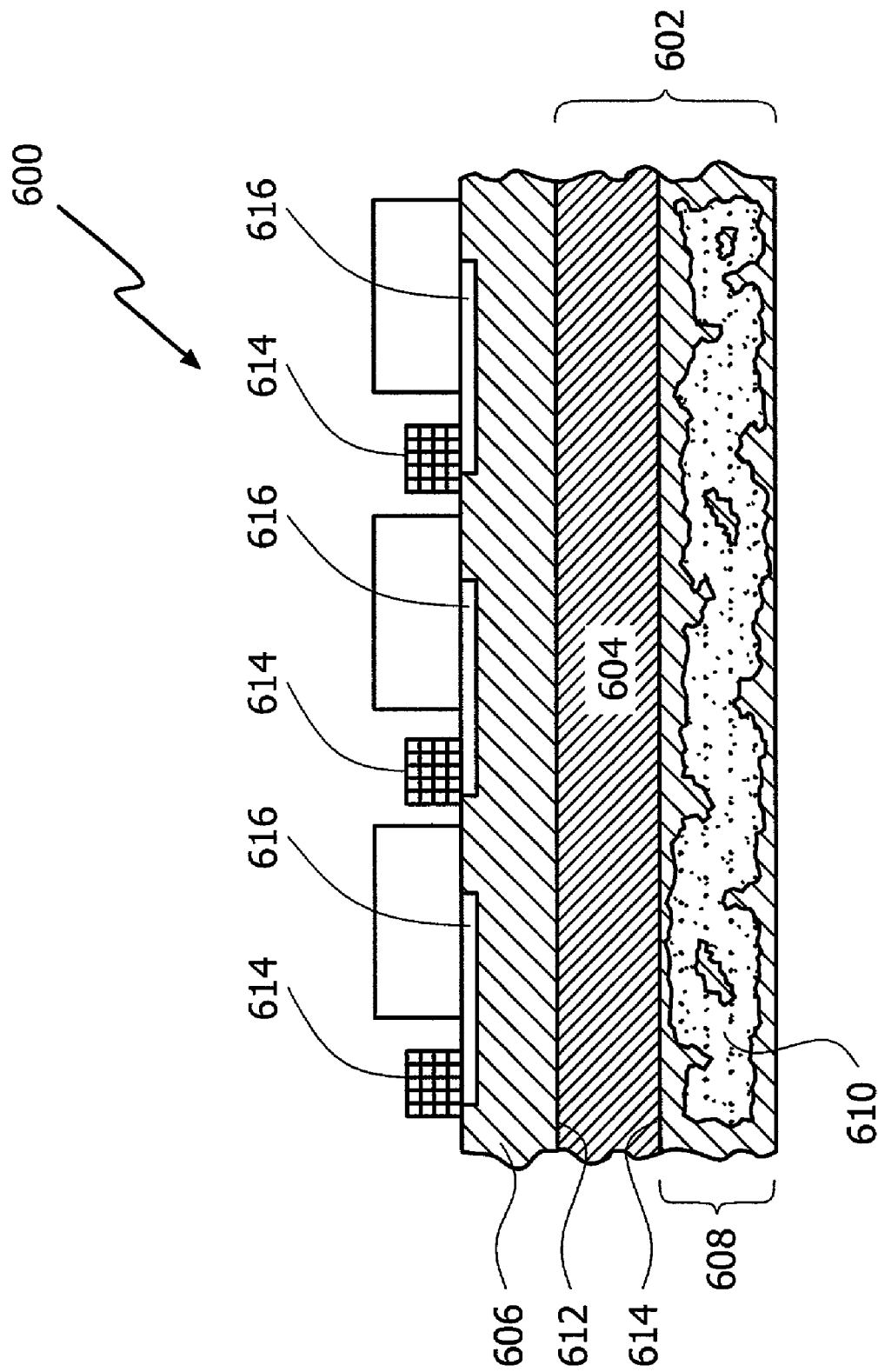
FIG. 6 shows a thermal management structure with a thermoelectric device.

An exemplary embodiment of a thermal management structure with a thermoelectric device is illustrated in FIG. 6 in structure 600. The thermal management structure 602 has a thermoelectric device 604 positioned between the substrate 606 and the structure 608 with the integrated phase change material 610. In the embodiment shown, the thermoelectric device is represented by a semiconductor-based thermoelectric device. The thermoelectric device 604 has a first surface 612 in both thermal and electrical communication with the substrate 606. At least a portion of the waste heat from the substrate mounted electrical load 614 is recycled to electrical energy by the recycle mode of the thermoelectric device 604 and is conducted back into the electrical load 614 via the electrical conductor of the substrate 606. A second surface 614 of the thermoelectric device is in thermal communication with the phase change material 610. At least a portion of the waste heat from the substrate mounted electrical load 614 is thermally transported to the phase change material 610 through the thermoelectric device 604 and absorbed by the phase change material 610.

As way of illustrative example only, a typical Bismuth Telluride TE can provide a 1.65 volt load with 8 amperes current with a 230° C. hot side/30° C. cold side temperature differential. The TE devices are commercially available devices such as HZ-14 from Hi-Z Technology Corporation of San Diego, Calif. The module size is 2.5 square inches with a thickness of 0.2 inches. Nominal input heat flux is 9.5 W/sq. cm, power output is 0.43 W/sq. cm and the efficiency is, therefore, 4.5%.

The theoretical maximum conversion efficiency of a TE device is a function of the hot side temperature and the temperature difference between the hot side and cold side. It is Carnot cycle limited where the conversion efficiency can be expressed as:

$$\eta = 1 - T_{cold}/T_{hot} \qquad \text{Eq. 1}$$

In equation 1, both the hot side and cold side temperatures are expressed in absolute temperature units (Kelvin or Rankine).

Figure 7:
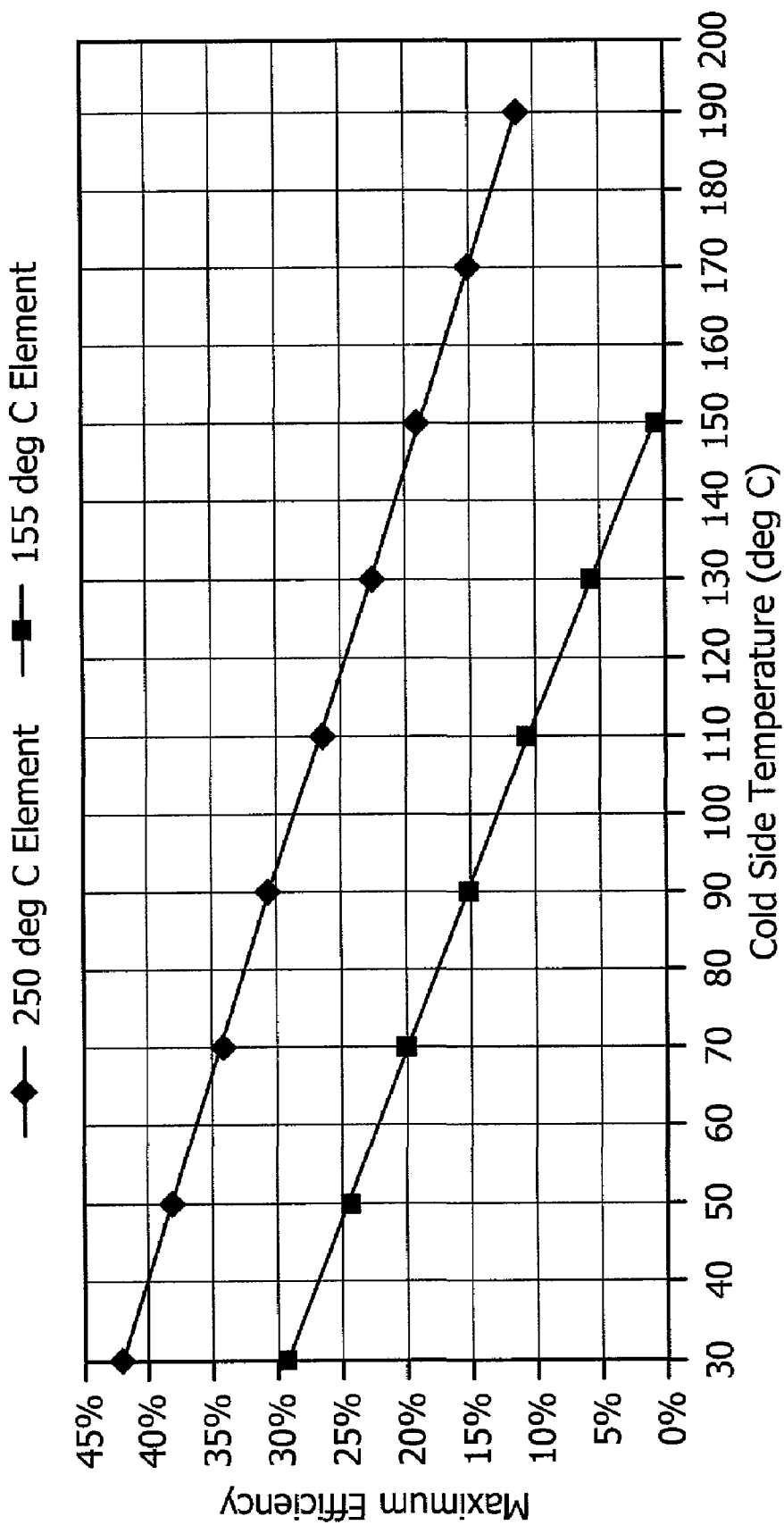
FIG. 7 is graph of theoretical efficiency for a thermoelectric device.

FIG. 7 shows the maximum conversion efficiency assuming a 155° C. rated device (efficiency range of 1 to 30 percent) or a 250° C. rated device (efficiency range from 1 to 42 percent). For the example given above where the actual efficiency was 4.5%, the maximum conversion efficiency is 40% assuming the 230° C. hot side/30° C. cold side temperatures.

Figure 8:
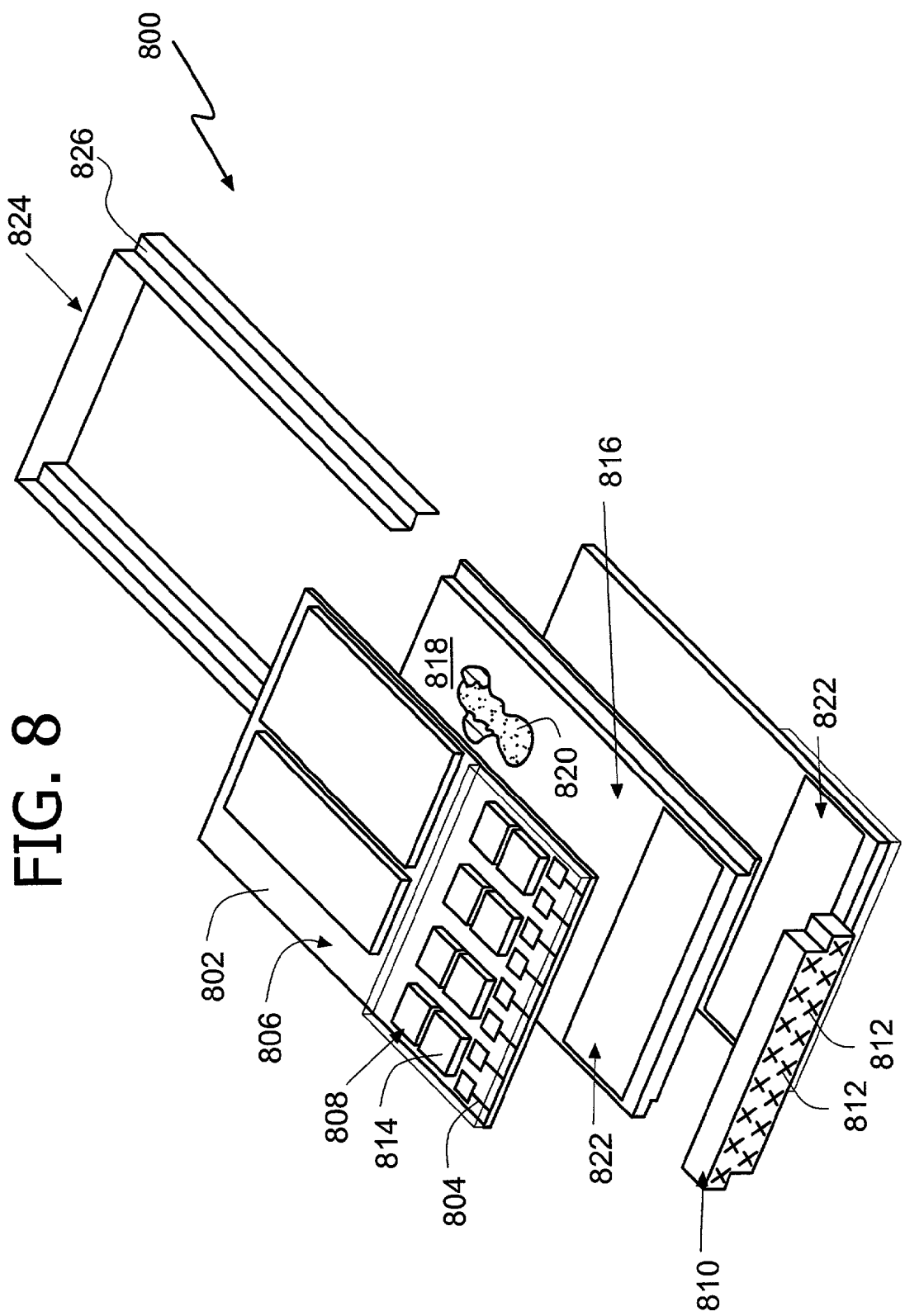
FIG. 8 is an embodiment of an integrated power and cooling apparatus for electronics.

An integrated power and cooling apparatus for electronics can be a transmit/receive apparatus. In an exemplary embodiment, the integrated power and cooling apparatus for electronics comprises a substrate with an electrical conductor on at least one side. As represented in FIG. 8, the integrated power and cooling apparatus 800 has a substrate 802 with an electrical conductor 804 on a first side 806. A plurality of electronic components define an electronic submodule. In an exemplary embodiment, the electronic submodule, represented by 808, is an arrangement of MMIC's, regulators, and control circuits. A radiating element is positioned proximate an outer surface of the integrated power and cooling apparatus and in electrical communication with the electronic submodule 808. In an exemplary embodiment, the radiating element, represented by 810, comprises one or more cross-slot elements 812.

An energy storage device is mounted on the substrate. In the exemplary embodiment, the energy storage device, represented by 814, is mounted on the substrate 802 in electrical communication with the electrical conductor 804.

A thermal management structure, represented by 816, comprises a structural support 818 and a phase change material 820 integrated into a void space of the structural support 818. A thermoelectric device 822 can optionally be included in the thermal management structure 816.

In exemplary embodiments, the substrate is a thermally conductive planar layer. For example, the substrate can be a composite-based or metallic-based substrate. Further, composite-based or metallic-based substrates such as graphite or SiC/Al can conduct thermal energy at a rate that is a minimum ten times greater than the thermal conduction capacity of a polyamide printed circuit board. In the exemplary embodiment shown, the substrate is graphite. The electronic conductor, represented by a deposited metallic trace or traces, can be any suitable electrical connection between nodes, components, features, and so forth on the substrate, i.e, can be patterned. The electronic conductors can be surface features or embedded features in the substrate.

The electronic submodule can be independent components arranged on the substrate in electrical communication, or the electronic components can be integrated with the substrate. For example, the electronic components can define an electronic submodule. The submodule can be disposed on the substrate in electrical communication with the electrical conductors. Alternatively, the electronic submodule can be integrated to the substrate. Examples of an integrated electronic submodule is disclosed in U.S. Pat. No. 5,353,498, the contents of which are incorporated herein by reference.

A cross-slot element is a structure having a channel in a surface with sloped edges and a dipole in an air gap. The cross-slot element serves as a horn of a radar and/or other radiating feature for electromagnetic radiation. The cross-slot element can be made from aluminum or other suitable metallic material. The radiating element can have a plurality of cross-slot elements. For example, the radiating element can be an array of cross-slot RF transmit/receive elements. Each cross-slot RF transmit/receive element is positioned on a first surface of the radiating element.

The separation distance from one cross-slot RF transmit/receive element to another cross-slot RF transmit/receive element is such to obtain a desired frequency of a radiated electromagnetic energy. In the exemplary embodiment pictured, the radiating element is shown as an array of two rows of eight cross-slot RF transmit/receive elements. An upper row is offset from a lower row approximately half the spacing distance between the cross-slot RF transmit/receive elements. The sequential spacing of the cross-slot RF transmit/receive elements in any one array is substantially equal to one-half the wavelength of the operating frequency of the radiating element.

In addition to one-half wavelength spacing, the offset of the 2×8 array picture results in a triangular arrangement. This triangular arrangement reduces side lobes and the associated decrease in operating performance for RF electromagnetic radiating apparatus, e.g., antennas and radars. An exemplary operating frequency for a radiating element is approximately 34 to 36 gigahertz. This correlates substantially to the IEEE Standard Ka band.

The energy storage device can be any suitable energy storage device that provides adequate power to operate the electronic loads of the apparatus. For example, the energy storage device can be a titanium or titanium-based energy storage device. For example, the energy storage device can have one or more electrodes made from titanium or titanium-based alloy. Commonly owned U.S. patent application Ser. No. 09/974,033 filed Oct. 10, 2001 ("Integrally Formed Energy Storage Device and Method of Fabrication"), the entire contents of which are herein incorporated by reference, discloses titanium and titanium-based alloy energy storage devices that can be integrally formed with support structures to form mounted and compact energy storage devices. An additional energy storage device can be a titanium or titanium-based capacitor.

The thermal management structure has a first surface that abuts the substrate. This interface allows thermal transport for at least a portion of the waste heat generated by the electronic submodule. For example, the surfaces conformally contact and/or abut each other at the interface. Optionally, a thermal transport aid, such as thermal paste, can be used at the interface between the contacting surfaces. The portion of the waste heat is absorbed by the structural support and the phase change material of the thermal management structure. The phase change material undergoes an endothermic phase change at a temperature below a maximum operating temperature of the electronics components. For example, the phase change material can be a solid phase change material that undergoes a phase change from solid to liquid or gas with an accompanying absorption of thermal energy equivalent to the latent heat required for the phase change. In alternative embodiments, the phase change material undergoes a phase change from liquid to gas with a corresponding absorption of energy representing the latent heat required for the phase change. Examples of phase change materials include paraffin wax, water, and so forth.

The phase change material is integrated into the void space of a structural support. The structural support can be, for example, duocel aluminum which provides an internal void space for the placement of the phase change material while also providing a strong outer structural surface to support the other elements of the integrated power and cooling apparatus. For example, an aluminum structural support can be a base layer in a stacked multilayer arrangement of the integrated power and cooling apparatus. Alternatively, the arrangement can be a conventional circuit card assembly, chip and wire hybrid microcircuit, flip chip, or high density interconnect.

The substrate, electronic submodule, radiating element, energy storage device, and thermal management structure can be integrated into a multilayer stack for compact packaging. In one aspect, the assembled structure can have an outer shell placed at the outermost layer about at least a portion of the outermost surface. In an exemplary embodiment, the multilayer stack is planar and an outer shell, represented by 824, is an edge element disposed about the assembled apparatus. In an additional exemplary embodiment, the outer shell can have an upper and lower face to completely enclose all but the radiating element of the apparatus. The outer shell can be formed of a stamped aluminum. Additionally, the outer shell provides a faradaic shield for the transmit/receive apparatus. This faradaic shield reduces the cross talk between multiple apparatus positioned proximate each other. In addition, the outer shell protects the assembly from mechanical shock and/or contact, and provides a flat interface 826 at which to abut and align adjacent apparatus to form larger multi-apparatus structures, e.g., 2 or more apparatuses.

The integrated power and cooling apparatus for electronics is scalable as a function of the frequency of the radiating element. For example, the desired frequency of the radiating element determines the cross-slot RF transmit/receive element spacing between each radiating element. Accordingly, the cross-slot RF transmit/receive element spacing then determines the module dimensions. In an exemplary embodiment, the overall module dimensions can be 2.6 inches in depth, 1.58 inches in width, and 0.344 inches in height resulting in a volume of approximately one and one-half cubic inches. These module dimensions can provide adequate volume for a radiating element having an operating frequency in Ka band.

The integrated power and cooling apparatus for electronics can be an apparatus for transmitting or receiving electromagnetic radiation. The apparatus can be positioned in an airborne vehicle, or any platform, e.g., a fixed of mobile vehicle, such as an airplane, a missile, a radiating array on a waterborne craft, or a radiating array on a land motor vehicle, or on a land-based system or a portable system, e.g., handheld of person-mounted unit, for transmitting or receiving electromagnetic radiation.

Figure 9:
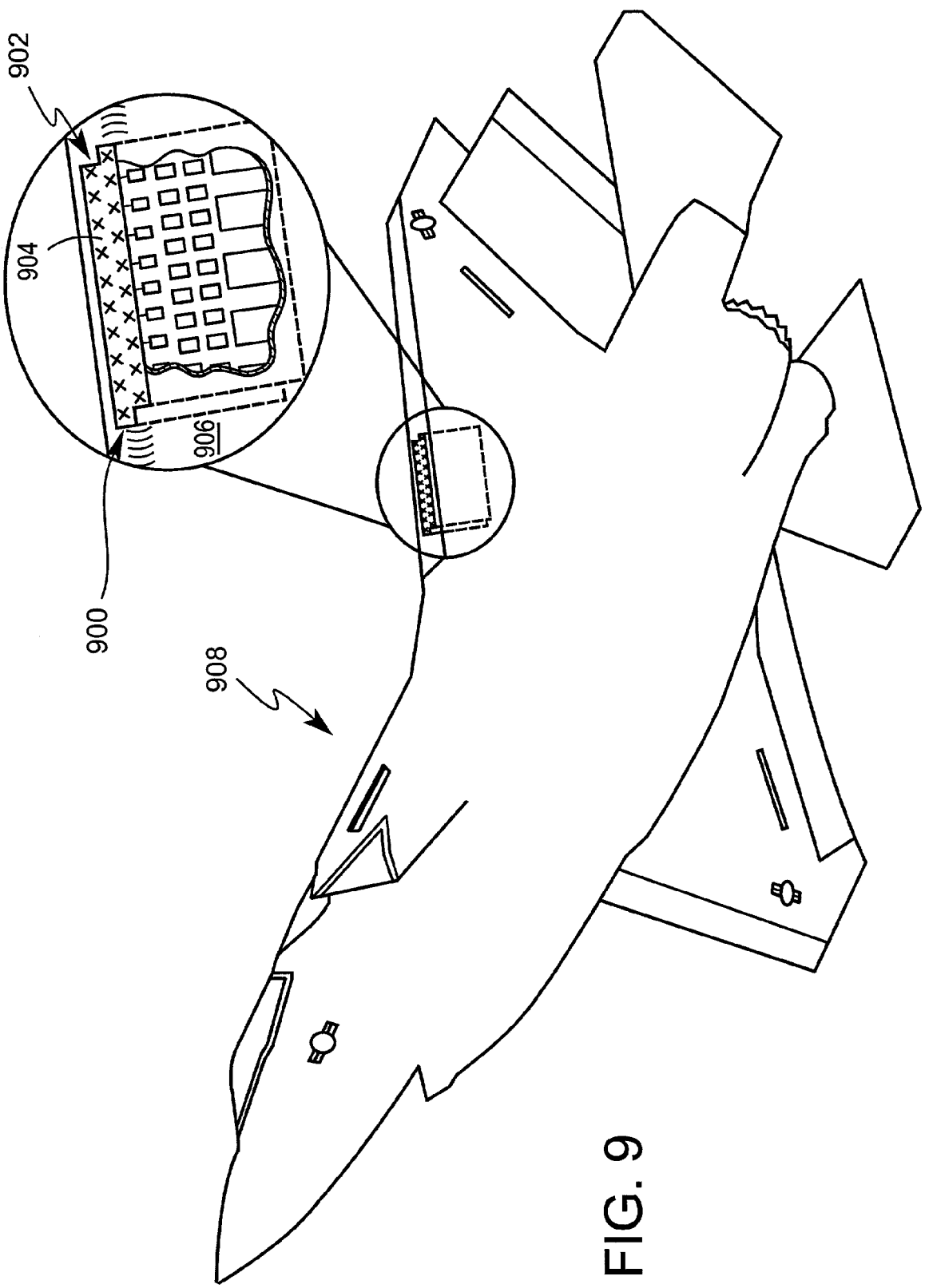
FIG. 9 is a perspective schematic of an integrated power and cooling apparatus for electronics in an airborne vehicle.

FIG. 9 is a perspective schematic of an integrated power and cooling apparatus for electronics positioned in a space in an airborne vehicle. As represented in FIG. 9, the airborne vehicle is an airplane, but the integrated power and cooling apparatus for electronics can be positioned in any airborne vehicle, e.g., a missile, a remotely piloted vehicle, and so forth. A unit 900 within a faradaic shield comprises a plurality of electronic elements, at least one energy storage device, at least one substrate, and at least one thermal management structure. At least one radiating element 902 is in electrical communication with the unit 900. A first surface 904 of the radiating element 902 is conformal to the outer surface 906 of the vehicle, represented by airplane 908. For example, a unit can be positioned within an aircraft wing and toward the leading edge of the aircraft wing. A first surface of the radiating element is conformally positioned with the surface of the leading edge such that the first surface on which the cross-slot RF transmit/receive elements are positioned is operable to transmit and/or receive RF energy while also being aerodynamically positioned. For land vehicle and land-based applications, the radiating element need not be conformally positioned within the platform, e.g. a vehicle, a hand-held device, or man-portable device. The other elements of the unit, e.g., the electronic elements, energy storage device, substrate, and thermal management structure, are arranged in planar-stacked arrangement and the electronic elements and the energy storage device being electrically interconnected to produce a desired wavelength of electromagnetic radiation emitted from the radiating element. In addition, the electronic elements, the energy storage device, the substrate, and the thermal management structure are in thermal contact to maintain a temperature of at least the electronic components below a predetermined maximum temperature.

The thermal management structure has a phase change material integrated into a void space of the support structure for the unit. The phase change material is selected to have a phase change at or below the predetermined maximum temperature associated with the electronic components. The thermal management structure can also have a thermoelectric device arranged between the electronic components and the phase change material that absorbs at least a portion of the waste heat generated by the electronic components and recycles a portion of that waste heat as electrical energy back to the electronic components while also passing thermal energy to the phase change material.

Electronics, such as a RF transmit/receive element, can dump large amounts of waste heat. In electronics, for example, in a RF transmit/receive element, a thermal capacity that is not sufficient to absorb the waste heat results in a rapid rise in junction temperature and contributes to device failure. The addition of a phase change material can enhance the system thermal capacity and absorb waste heat resulting in a lower temperature rise and minimizing any thermal impact on the RF transmit/receive element.

An exemplary method to manage thermal energy generated by an electronic device develops a thermal gradient across a thermal management structure. The thermal management structure has a phase change material. In an exemplary embodiment, the phase change material can be integrated into the void space of a support structure for the thermal management structure and/or the void space of a support structure for the electronic device. Electrical energy is supplied to the electronic device, which generates thermal energy. In an exemplary embodiment, the electrical energy is supplied by an energy storage device, although the electrical energy can also be supplied by, for example, a prime power source. A first portion of the thermal energy generated by an electronic device is dissipated using the phase change material. In an exemplary embodiment, the first portion of the thermal energy is absorbed by the phase change material and produces a phase change.

In an exemplary embodiment of the method, at least a second portion of the thermal energy generated by the electronic device is absorbed by a thermoelectric device positioned between the electronic device and the phase change material. The absorbed thermal energy is converted by the thermoelectric device into electric energy. The converted electrical energy is then supplied to the electronic device. The converted electrical energy can be supplied either directly to the electronic device or indirectly by being first supplied to a energy storage device or other electrical load dampening device, e.g., a device that dampens voltage and/or current transients on an electrical circuit.

Although the present invention has been described in connection with several embodiments thereof, it will be appreciated by those skilled in the art that additions, deletions, modifications, and substitutions not specifically described can be made without department from the spirit and scope of the invention as defined in the appended claims.

What is claimed is:

1. An integrated power and cooling apparatus for electronics, comprising:
   a substrate having an electrical conductor;
   an energy storage device mounted on the substrate;
   an electrical load mounted on the substrate in electrical communication with the energy storage device; and
   a thermal management structure abutting the substrate and in thermal communication with at least a portion of a heat producing section of the electrical load, wherein the thermal management structure comprises a structural support and a phase change material integrated into a void space of the structural support,
   wherein the structural support is a foam aluminum.

2. The apparatus of claim 1, wherein the thermal management structure comprises a thermoelectric device in electrical communication with the electrical load and in thermal communication with both the portion of the heat producing section of the electrical load and the phase change material.

3. The apparatus of claim 1, wherein the substrate is a composite-based or a metallic-based substrate.

4. The apparatus of claim 1, wherein the substrate comprises graphite or silicon-carbide-aluminum.

5. The apparatus of claim 1, wherein the electrical conductor is on at least one side of the substrate.

6. The apparatus of claim 1, wherein the energy storage device has at least one electrode made from titanium or a titanium-based alloy.

7. The apparatus of claim 1, wherein the energy storage device is a titanium or titanium-based capacitor.

8. The apparatus of claim 1, wherein the energy storage device is in electrical communication with the electrical load via the electrical conductor.

9. The apparatus of claim 1, wherein the electrical load is a component in an antenna or radar system.

10. The apparatus of claim 9, wherein the component is one or more of a monolithic millimeterwave integrated circuit and a radio frequency transmit/receive element.

11. The apparatus of claim 1, wherein the phase change material is a solid phase change material.

12. An apparatus comprising:
    a substrate with an electrical conductor on at least one side thereof;
    an electrical load mounted on the substrate in electrical communication with the electrical conductor; and
    a thermal management structure abutting the substrate and in thermal communication with at least a portion of a heat producing section of the electrical load, wherein the thermal management structure comprises a structural support, a phase change material integrated into a void space of the structural support, and a thermoelectric device in electrical communication with the electrical conductor and in thermal communication with both the heat producing portion of the electrical load and the phase change material.

13. The apparatus of claim 12, wherein the substrate is a composite-based or a metallic-based substrate.

14. The apparatus of claim 12, wherein the substrate comprises graphite or silicon-carbide-aluminum.

15. The apparatus of claim 12, wherein the electrical load is a component in an antenna or radar system.

16. The apparatus of claim 15, wherein the component is one or more of a monolithic millimeterwave integrated circuit and a radio frequency transmit/receive element.

17. The apparatus of claim 12, wherein the structural support is a foam aluminum.

18. The apparatus of claim 12, wherein the phase change material is a solid phase change material.

19. The apparatus of claim 12, comprising an energy storage device mounted on the substrate in electrical communication with the electrical load.

20. The apparatus of claim 19, wherein the energy storage device has at least one electrode made from titanium or a titanium-based alloy.

21. The apparatus of claim 19, wherein the energy storage device is a titanium or titanium-based capacitor.

22. A transmit/receive apparatus comprising:
    a substrate with an electrical interconnect circuit on at least one side thereof;
    a plurality of electronic components defining an electronics submodule, the electronics submodule disposed on the substrate in electrical communication with the electrical interconnect circuit;
    a radiating element proximate an outer surface of the transmit/receive apparatus and in electrical communication with the electronics submodule;

an energy storage device mounted on the substrate in electrical communication with the electrical interconnect circuit; and a thermal management structure abutting the substrate and in thermal communication with at least a portion of the heat producing section of the electronics submodule, wherein the thermal management structure comprises a structural support and a phase change material integrated into a void space of the structural support.

23. The transmit/receive apparatus of claim 22, wherein the plurality of electronic components comprises at least one of a monolithic millimeterwave integrated circuit, a radio frequency transmit/receive element, a regulator, and a control circuit.

24. The transmit/receive apparatus of claim 22, wherein the radiating element comprises one or more cross-slot elements.

25. The transmit/receive apparatus of claim 22, wherein the radiating element is an array of cross slot radio frequency transmit/receive elements, each cross slot radio frequency transmit/receive element disposed in a first surface thereof and separated from another cross slot radio frequency transmit/receive element to obtain a desired frequency of a radiated energy.

26. The transmit/receive apparatus of claim 25, wherein the array is a two-by-eight arrangement of cross-slot radio frequency elements.

27. The transmit/receive apparatus of claim 25, wherein each element separated from another element is separated by a distance corresponding to one-half the wavelength of the desired frequency.

28. The transmit/receive apparatus of claim 25, wherein the desired frequency is approximately 34–36 GHz.

29. The transmit/receive apparatus of claim 22, wherein the electronics submodule is mounted on the substrate or is integrated into the substrate.

30. The transmit/receive apparatus of claim 22, comprising an outer shell disposed as the outermost layer about at least a portion of the outer surface.

31. The transmit/receive apparatus of claim 30, wherein the outer shell is formed of a stamped aluminum.

32. The transmit/receive apparatus of claim 30, wherein the outer shell provides a Faraday shield for the transmit/receive apparatus.

33. The transmit/receive apparatus of claim 22, wherein the thermal management structure comprises a thermoelectric device in electrical communication with the electrical interconnect circuit and in thermal communication with the portion of the heat producing section of the electronics submodule and at least a portion of the phase change material.

34. The transmit/receive apparatus of claim 33, wherein the thermoelectric device is disposed as a thin film on an opposite side of the substrate from the electronics submodule and is electrically connected to the energy storage device.

35. The transmit/receive apparatus of claim 22, wherein the substrate is a composite-based or metallic-based substrate.

36. The transmit/receive apparatus of claim 35, wherein the composite-based substrate is graphite.

37. The transmit/receive apparatus of claim 35, wherein the metallic-based substrate is silicon-carbide-aluminum.

38. The transmit/receive apparatus of claim 22, wherein the structural support is a foam aluminum.

39. The transmit/receive apparatus of claim 22, wherein the phase change material is a solid phase change material.

40. The transmit/receive apparatus of claim 22, wherein the energy storage device has at least one electrode made from titanium or a titanium-based alloy.

41. The transmit/receive apparatus of claim 22, wherein the energy storage device is a titanium or titanium-based capacitor.

42. An apparatus positioned in a space of an airborne vehicle for transmitting or receiving electromagnetic radiation, the apparatus comprising:

a unit within a faradaic shield comprising a plurality of electronic elements, at least one energy storage device, at least one substrate, and at least one thermal management structure; and at least one radiating element having a first surface that is conformal to an outer surface of the airborne vehicle and a second surface that is in electrical communication with the unit, wherein each of the electronic elements, the energy storage device, the substrate, and the thermal management structure are arranged in a planar-stacked arrangement, the electronic elements and the energy storage device being electrically interconnected to produce a desired wavelength of electromagnetic radiation emitted from the radiating element, and wherein the electronic elements, the energy storage device, the substrate, and the thermal management structure are in thermal contact to maintain a temperature of at least the electronic components below a predetermined temperature.

43. The apparatus of claim 42, wherein the thermal management structure comprises a phase change material integrated into a void space of a support structure for the unit, the phase change material selected to have a phase change at or below the predetermined temperature.

44. The apparatus of claim 42, wherein the thermal management structure comprises a thermoelectric device arranged between the electronic components and the phase change material.

45. A method to manage thermal energy generated by an electronic device, the method comprising the steps of:

developing a thermal gradient across a thermal management structure comprising a phase change material;

supplying an electrical energy to the electronic device, which generates thermal energy;

dissipating a first portion of the thermal energy generated by the electronic device using the phase change material, absorbing at least a second portion of the thermal energy generated by the electronic device using a thermoelectric device positioned between the electronic device and the phase change material;

converting thermal energy absorbed by the thermoelectric device into electrical energy; and supplying the converted electrical energy to the electronic device.

46. The method of claim 45, wherein the first portion of the thermal energy from the step of dissipating produces a phase change in the phase change material.

47. The method of claim 45, wherein the first portion of a balance of the thermal energy from the step of dissipating produces a phase change in the phase change material.

* * * * *